United States Patent
Liaw et al.

(10) Patent No.: US 6,798,075 B2
(45) Date of Patent: Sep. 28, 2004

(54) GRID ARRAY PACKAGED INTEGRATED CIRCUIT

(75) Inventors: Yuang-Tsang Liaw, Tai-Chung (TW); Wen-Yuan Chang, Taipei Hsien (TW); Hung-Yin Tsai, Taipei Hsien (TW)

(73) Assignee: VIA Technologies Inc., Hsin-Tien (TW)

( * ) Notice: Subject to any disclaimer, the term of this patent is extended or adjusted under 35 U.S.C. 154(b) by 273 days.

(21) Appl. No.: 10/064,452

(22) Filed: Jul. 16, 2002

(65) Prior Publication Data

US 2003/0015784 A1 Jan. 23, 2003

(30) Foreign Application Priority Data

Jul. 20, 2001 (TW) ........................................ 90117752 A (51) Int. Cl.⁷ .......................... H01L 23/48; H01L 21/44
(52) U.S. Cl. ..................... 257/784; 257/786; 438/612
(58) Field of Search ................................ 257/773, 774, 257/784, 786; 438/22, 26, 48, 106, 612–615, 617, 618, 620; 228/180.5

(56) References Cited

U.S. PATENT DOCUMENTS

| | | | | |
|---|---|---|---|---|
| 5,796,171 A | * | 8/1998 | Koc et al. | 257/786 |
| 5,814,892 A | * | 9/1998 | Steidl et al. | 257/784 |
| 6,638,793 B1 | * | 10/2003 | Chen | 438/123 |
| 2004/0004296 A1 | * | 1/2004 | Cheng et al. | 257/786 |

* cited by examiner

Primary Examiner—Alonzo Chambliss
(74) Attorney, Agent, or Firm—Winston Hsu (57) ABSTRACT

A grid array packaged integrated circuit includes a substrate and a chip with a core circuit. The chip is disposed on the substrate. The chip includes I/O devices, bonding pad arranged on the chip in a multi-tier manner surrounding the I/O devices, metal traces and vias on metal layers of the chip for electrically connecting each I/O device and each bonding pad, rings and fingers surrounding the chip on the substrate, and bonding wires for electrically connecting each bonding pad to a corresponding finger or to a corresponding ring. Bonding pads electrically connected to different voltage levels can share the same I/O device.

18 Claims, 8 Drawing Sheets

GRID ARRAY PACKAGED INTEGRATED CIRCUIT

BACKGROUND OF INVENTION

1. Field of the Invention

The present invention relates to a grid array (GA) packaged integrated circuit (IC), and more specifically, to a grid array packaged integrated circuit with reduced ground path impedance and improved yield for metal connection processes.

2. Description of the Prior Art

The desire for ever more compact electronic devices has pushed for size reductions in integrated circuits. When designing such circuits, both the internal impedances of the chip and the impedance of the bonding wires used for packaging must be taken into consideration to prevent signal distortion, signal lag and signal interaction. Reduced design size increase the difficulty of the manufacturing process, and therefore result in decreased yield. It is thus important to design and manufacture chips having low impedance without decreasing the yield.

Figure 1:
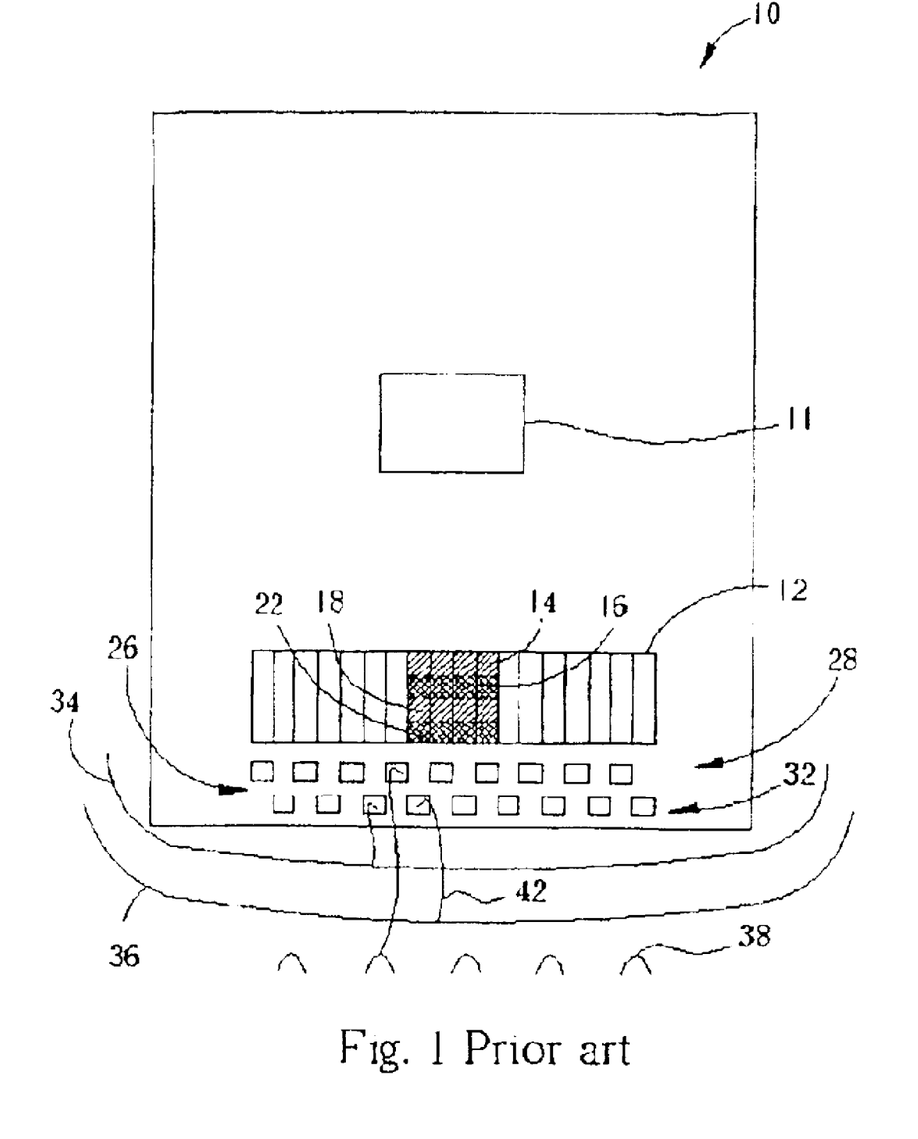
FIG. 1 is a schematic diagram of a prior art grid array (GA) packaged chip.

Please refer to FIG. 1. FIG. 1 is a schematic diagram of a prior art grid array (GA) packaged integrated circuit (IC). The prior art IC comprises a substrate (not shown) and a chip 10 attached on the substrate. The chip 10 comprises a core circuit 11 and a plurality of I/O devices 12 along the periphery of the core circuit 11. The layout method for the chip 10 divides the top metal layer in each I/O device 12 into four regions, from an inner most region to an outermost region. The four top metal layers surround the core circuit 11 as four metal rings by surrounding the I/O devices 12 along the periphery of the chip 10. The four power rings (only one side is shown) are, from innermost region to outermost region, a core circuit ground ring (GND) 14, a core circuit power ring ($V_{DD}$) 16, an I/O buffering circuit power ring ($V_{CC}$) 18, and an I/O buffering circuit ground ring ($V_{SS}$) 22. The four metal rings are sequentially arranged, from the center portion of the chip 10 to the outer periphery, as the I/O devices 12, each having a striped shape to serve as power and ground sources to the internal circuit of the I/O device. Depending upon the application, the order of power and ground rings may be changed to more properly accommodate the layout of the I/O buffering circuit.

In other words, each I/O device comprises four different and separate I/O units: the core circuit ground I/O, core circuit power ($V_{DD}$)I/O, I/O buffering circuit power ($V_{CC}$) I/O and I/O buffering circuit ground ($V_{SS}$) I/O. The four I/O units are arranged in sequence, aligned from the center portion of the chip to the outside, to form an I/O device having a striped shape.

On the surface of the chip 10, outside the periphery of the plurality of the I/O devices 12, are a plurality of bonding pads 26 (one side is shown only). The bonding pads 26 in the prior art grid array packaged integrated circuit 10 are arrayed in a two-tier staggered manner. An inner row of bonding pads, located closer to the center of the chip 10, form the first row of bonding pads 28, which are used as signal bonding pads. An outer row of bonding pads form the second row of bonding pads 32, which are used as ground and power bonding pads, and sometimes signal bonding pads, according to the characteristics required by the circuit design.

Figure 2:
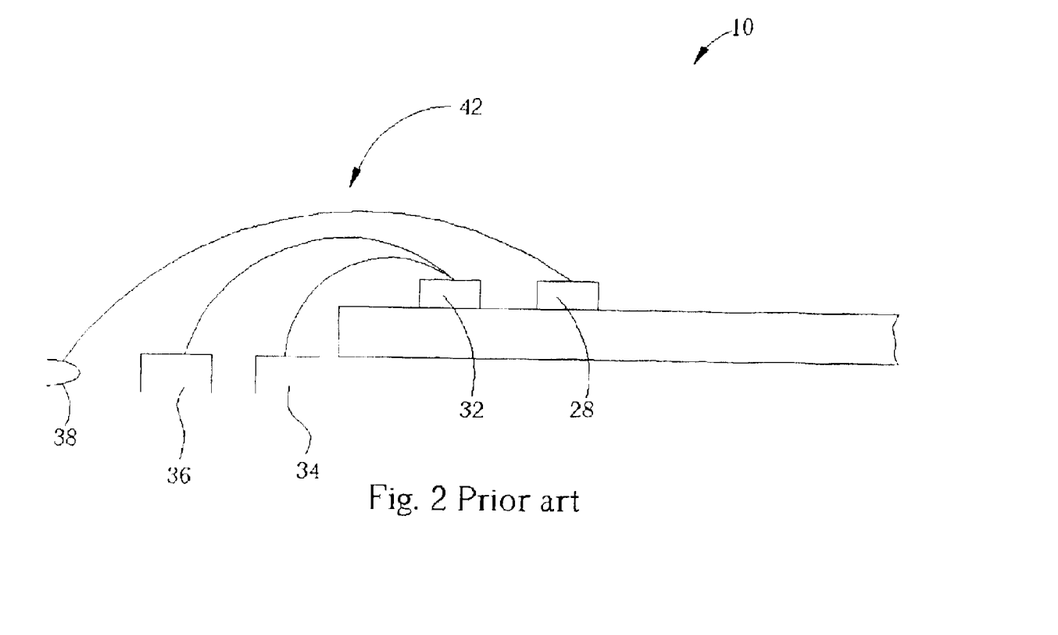
FIG. 2 is a side view of a prior art between bonding pads, rings and fingers in a grid array packaged chip.

The I/O devices 12 and the corresponding plurality of bonding pads 26 in the prior art integrated circuit have an one to one correspondence relationship. That is, each I/O device 12 corresponds to a bonding pad 26, and the two are electrically connected to each other by metal traces (not shown) and vias (not shown). As shown in FIGS. 1 and 2, a ground ring 34, a power ring 36 and signal fingers 38 are disposed on the substrate. Bonding pads of the first row 28 are electrically connected to the outermost signal fingers 38 through bonding wires 42. The bonding pads of the second row 32 are electrically connected to the ground ring 34 or the power ring 36 through bonding wires 42, respectively.

Power is supplied in the prior art integrated circuit chip 10 through the power ring 36, bonding pads 26, I/O devices 12 and finally to the core circuit 11, in order. As noted earlier, the bonding pads 28 of the first row and the bonding pads 32 of the second row are arranged in a staggered manner (as shown in FIG. 1). In order to satisfy high-density packaging requirements, the pad pitch between pads 26 must be reduced to accommodate more pads 26 and corresponding I/O devices 12.

Figure 3:
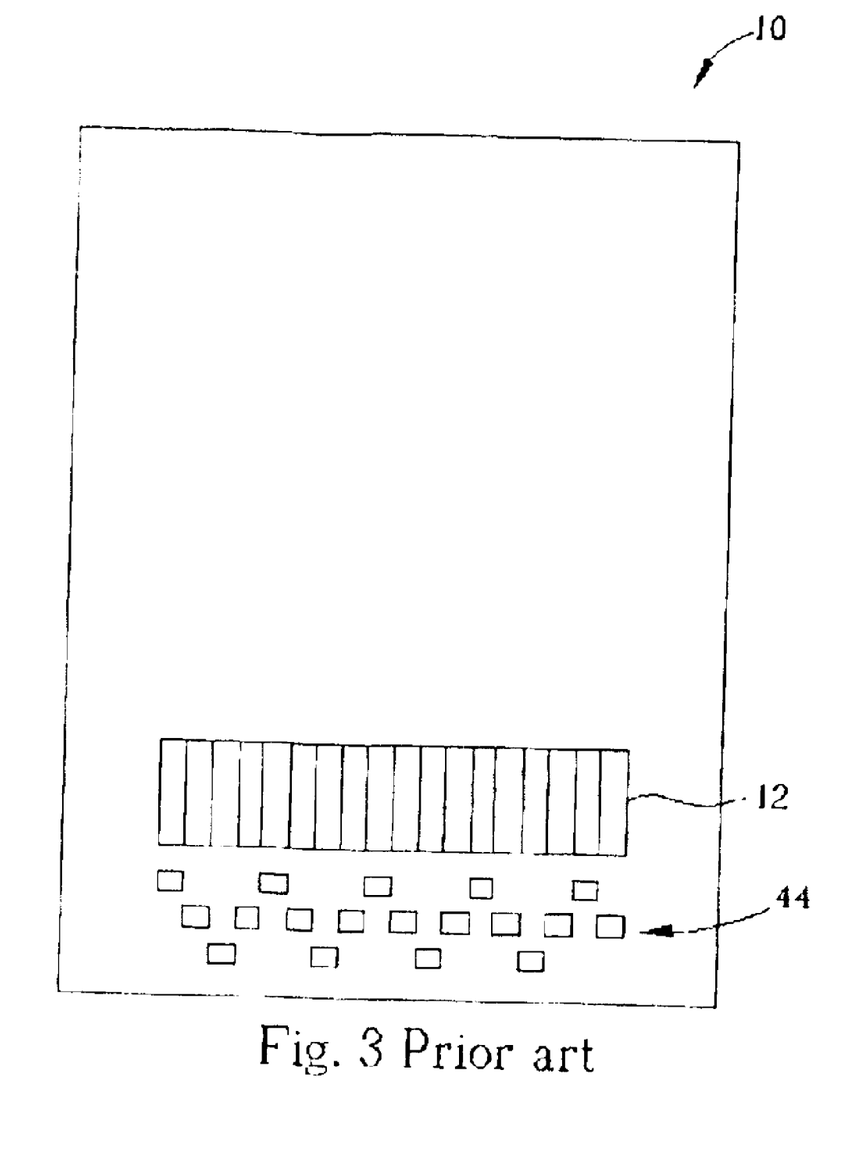
FIG. 3 is a schematic diagram of bonding pads in a prior art grid array packaged chip.

High-density designs shrink the pad pitch of the first row of bonding pads 28 and the second row of bonding pads 32 to increase bonding pads 26. However, the chip size cannot be effectively reduced. Moreover, the total number of bonding pads 26 formed on the chip 10 is limited since the I/O devices 12 correspond to the bonding pads 26 in a one to one manner. As shown in FIG. 3, bonding pads 44 may also be arranged in a tri-tier manner in another prior art embodiment. However, although this arrangement will slightly increase the number of bonding pads, it does not reduce the chip size, nor sufficiently increases the total number of bonding pads to provide sufficient current branches and reduce the inductance. During high frequency operational ranges, inductance dominates the magnitude of the impedance ($Z=R+j\omega L$). High impedance results in serious power/ground bounce and voltage degradation within the integrated circuit.

SUMMARY OF INVENTION

It is therefore an objective of the present invention to provide a grid array packaged chip that offers reduced chip sizes and reduced circuit impedance to solve the above-mentioned problems.

Briefly, the present invention discloses a grid array packaged integrated circuit that includes a substrate and a chip with a core circuit. The chip is disposed on the substrate. The chip includes I/O devices, bonding pads arranged on the chip in a multi-tier manner surrounding the I/O devices, metal traces and vias on metal layers of the chip for electrically connecting each I/O device and each bonding pad, rings and fingers surrounding the chip on the substrate, and bonding wires for electrically connecting each bonding pad to a corresponding finger or to a corresponding ring. Bonding pads electricaly connected to different voltage levels can share the same I/O device.

It is an advantage that the present invention provides a greater number of power and ground bonding pads, and thus enables sufficient current branches to reduce the total impedance of the circuit. Additionally, the disposition of bonding wires is such that their total lengths are kept minimal, thus further reducing circuit impedance.

These and other objectives of the present invention will become obvious to those of ordinary skill in the art after reading the following detailed description of the preferred embodiments accompanied with the drawings.

DETAILED DESCRIPTION

Figure 4:
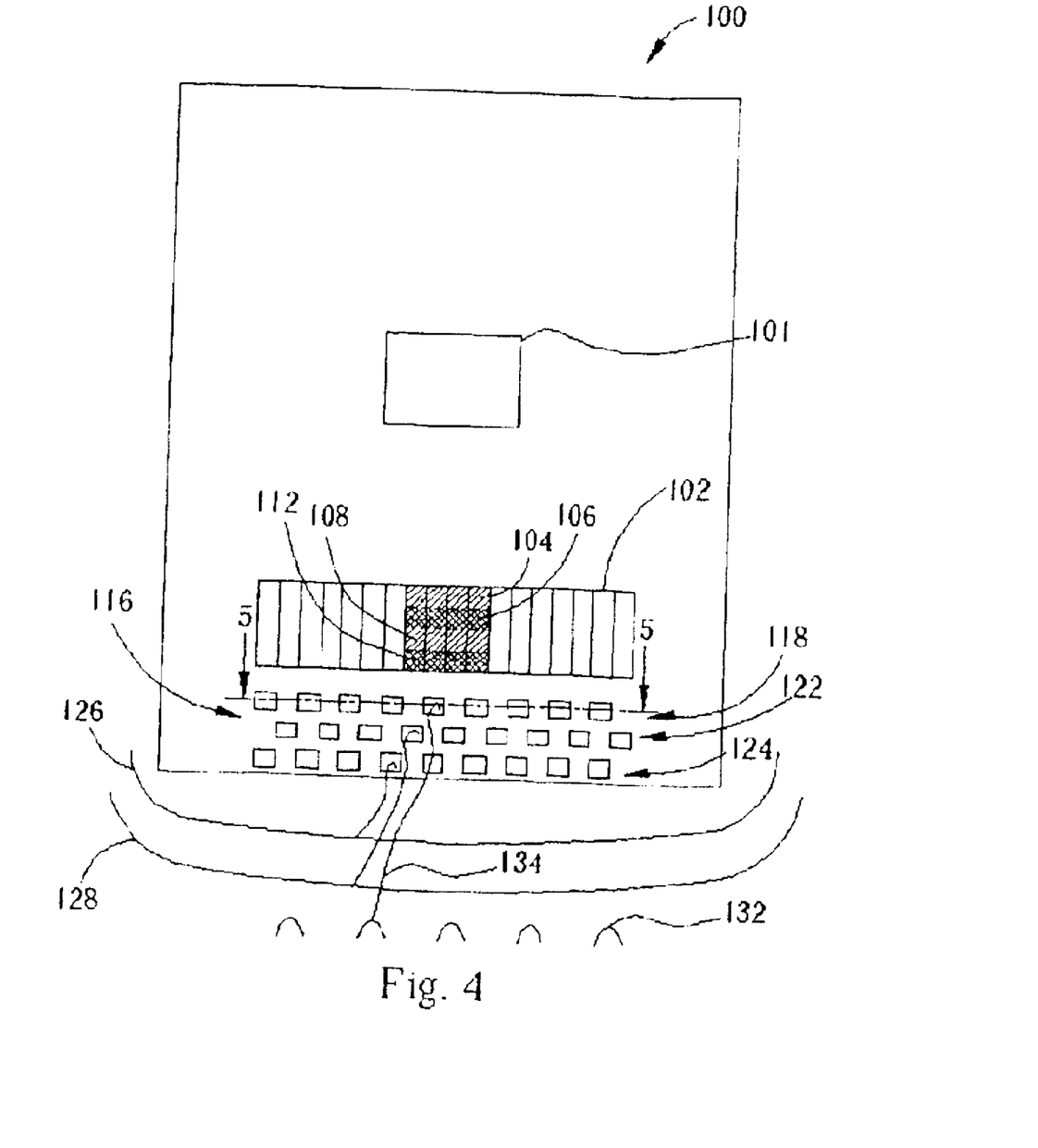
FIG. 4 is a schematic diagram of the preferred embodiment of a grid array packaged integrated circuit according to the present invention.

Please refer to FIG. 4. FIG. 4 is a schematic diagram of the preferred embodiment of a grid array packaged integrated circuit according to the present invention. The integrated circuit comprises a substrate (not shown) and a chip 100 disposed on the substrate. The chip 100 comprises a core circuit 101 and a plurality of I/O devices 102 in the outer periphery of the core circuit 101. The present invention divides the top metal layer in each I/O device 102 preferably into four different regions from innermost to outermost. The surrounding four different regions on the topmost metal layer respectively form surrounding metal power rings. These resulting four I/O rings are, from innermost to outermost, a core circuit ground ring (GND) 104, a core circuit power ring ($V_{DD}$) 106, an I/O buffering circuit power ring ($V_{CC}$) 108, and an I/O buffering circuit ground ring ($V_{SS}$) 112. Depending upon the situation, though, the order of power and ground rings may be suitably exchanged. The four I/O units are arranged in sequence, from the center portion of the chip 100 to the outer portion, form the repetitive arrangement of the I/O devices 102, which have a striped shape. The integrated circuit is typically a very large scale integration (VLSI) circuit or an ultra large scale integration (ULSI) circuit.

In other words, each I/O device preferably comprises four different I/O units: a core circuit ground I/O (GND), core circuit power ($V_{DD}$) I/O, I/O buffering circuit power ($V_{CC}$) I/O, and an I/O buffering circuit ground ($V_{SS}$) I/O. In the preferred embodiment of the present invention, the four I/O units are arranged in sequence, from the center portion of the chip to the outer portion of the chip, forming an I/O device having a striped shape. These I/O devices are then arranged in a repetitive manner.

In the outer periphery of the I/O devices 102 on the surface of the chip 100, there are a plurality of bonding pads 116. In the preferred embodiment of the present invention, the bonding pads 116 are arranged in a tri-tier staggered manner. An inner row of bonding pads, located closer to the center of the chip 100, is the first row of bonding pads 118, which are defined in this embodiment as signal bonding pads. A middle row of bonding pads are second row of bonding pads 122, which can be defined as power bonding pads, signal bonding pads or ground bonding pads according to the characteristics of the design of the electrical circuit. From the point of view of wire bonding in IC packaging, the second row of bonding pads 122 are preferably defined in this embodiment as power bonding pads. An outer row of bonding pads, closer to the perimeter of the chip 100, are third row of bonding pads 124, which may be defined as ground bonding pads or I/O buffering circuit ground ($V_{SS}$) bonding pads. Since in this embodiment, the top metal layer of the outmost ring 112 in the I/O devices 102 is utilized by the I/O buffering circuit ground, i.e. $V_{SS}$, it is preferable to correspondingly use the third row of bonding pads 124 as $V_{SS}$ bonding pads to save the space of the I/O devices occupied by $V_{SS}$ in the prior art method. The bonding pads 116 are electrically connected to either a ground ring 126, a power ring 128, or signal bonding fingers 132 on the substrate through bonding wires 134.

In this embodiment, power is supplied to the chip 100, in order, from the power ring 128, the bonding pads 116, the I/O devices 102, and finally to the core circuit 101. Although this powerpath is similar to the power path of the prior art, the circuit layout and the arrangement between the I/O devices 102 and the bonding pads 116, and the circuit layout between the bonding pads 116 and the rings 126, 128 and the signal bonding fingers 132, are completely different.

Figure 5:
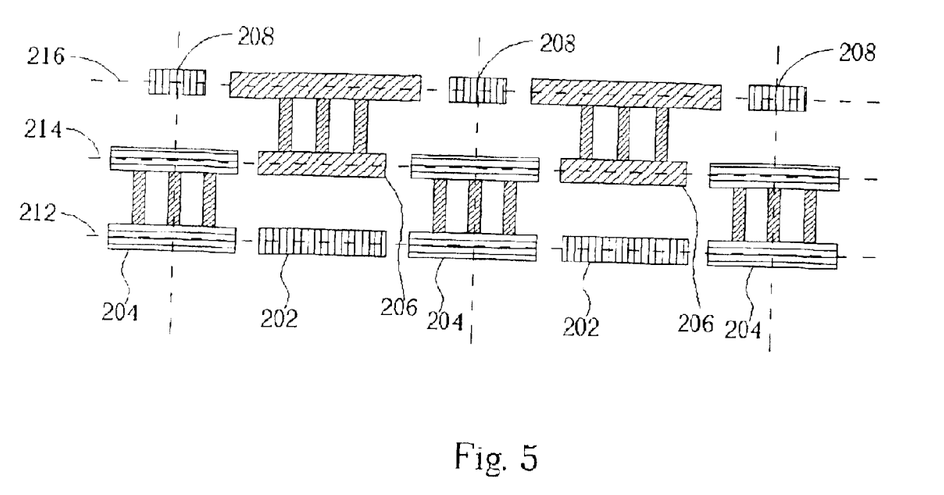
FIG. 5 is a cross-sectional schematic diagram along line 5—5 of FIG. 4.
Figure 6:
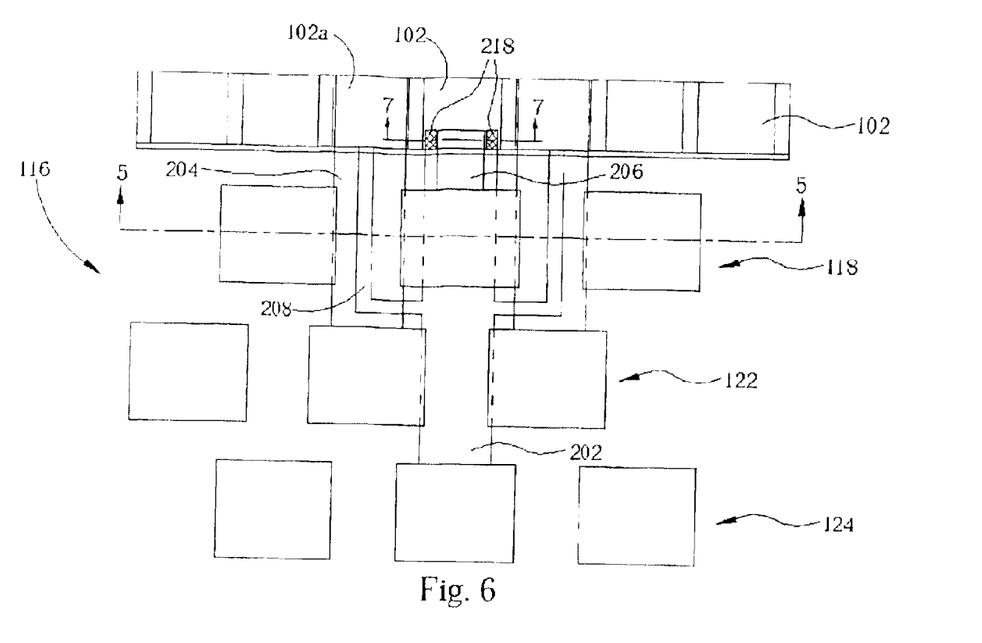
FIG. 6 is a top view of metal traces between I/O devices and bonding pads according to the present invention.
Figure 7:
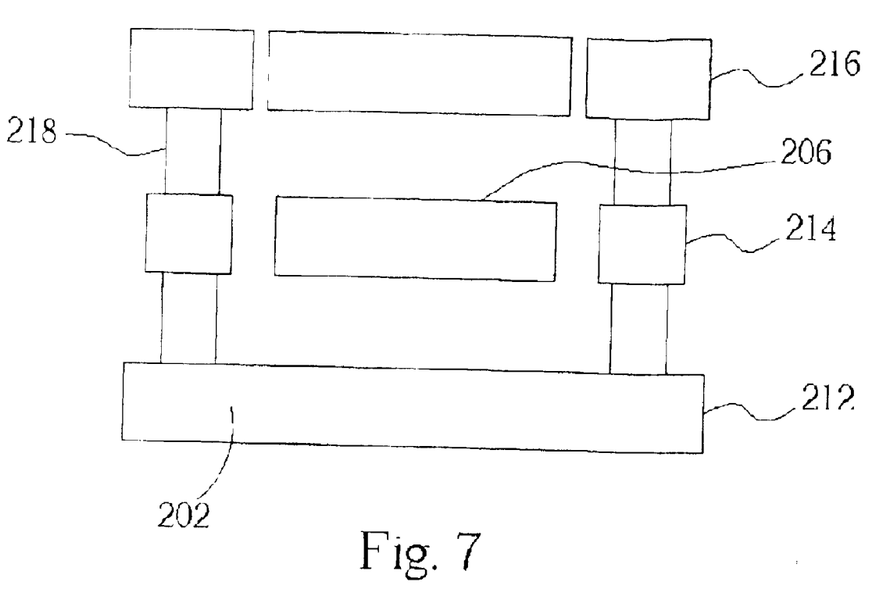
FIG. 7 is a cross-sectional schematic diagram along line 7—7 of FIG. 6.
Figure 8:
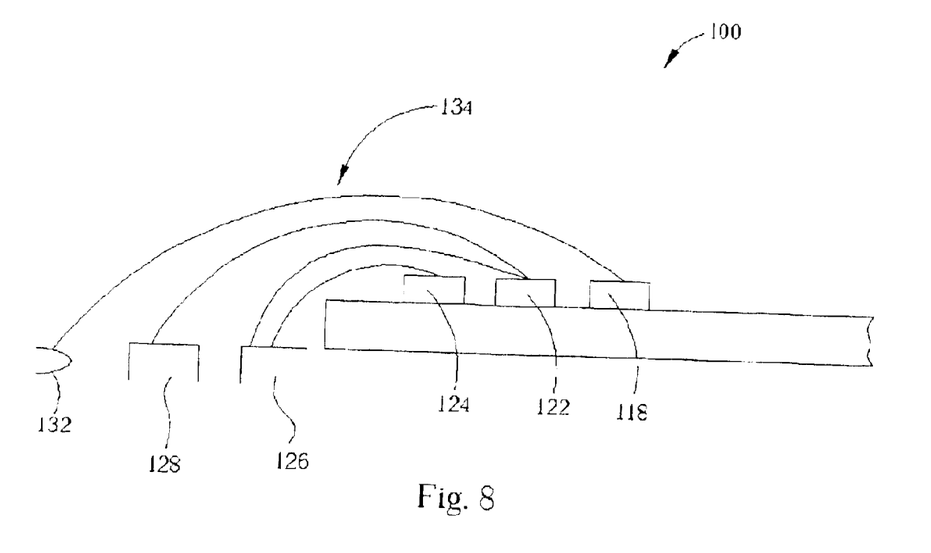
FIG. 8 is a side view of the electrical connection between bonding pads, rings and signal bonding fingers according to the present invention.

Please refer to FIG. 5 through FIG. 8. FIG. 5 is a cross-sectional schematic diagram along line 5—5 in FIG. 4, and illustrates the distribution of metal traces corresponding to three metal layers according to the present invention. FIG. 6 is a top view of metal traces between the I/O devices 102 and the bonding pads 116 according to the present invention. FIG. 7 is a cross-sectional schematic diagram along line 7—7 in FIG. 6. FIG. 8 is a side view of the electrical connection between the bonding pads 116, the rings 126, 128 and the signal bonding fingers 132 according to the present invention. As shown in FIG. 5, the metal traces in one embodiment of the present invention are distributed within three metal layers. The $V_{SS}$ metal traces 202 are laid out on the first metal layer 212, which is situated as the bottom-most of the three metal layers. The power metal traces 204 are laid out on the first metal layer 212 and the second metal layer 214 respectively through vias 218. The signal metal traces 206 are laid out on the second metal layer 214 and the third metal layer 216 respectively through vias 218.

During circuit layout, the ground or power metal traces require a metal trace width for the purpose of sustaining sufficient amounts of current to provide stabile power source and good signal quality. The signal metal traces 206 do not need to occupy the entire width of each I/O device 102. Hence, the $V_{SS}$ metal traces 202 and the signal metal traces 206 can share the metal trace width by using vias. Please refer to FIG. 5, FIG. 6 and FIG. 7. $V_{SS}$ voltage is electrically connected from the third metal layer 216 to the $V_{SS}$ metal traces 202 within the first metal layer at the bottom through a plurality of vias in the via area 218, and then is electrically connected to the $V_{SS}$ bonding pads in the third row of bonding pads 124, which is the outmost row, through the metal traces 202 and a plurality of vias (not shown). Signal is electrically connected to the signal metal traces 206 within the second metal layer 214 directly, and then electrically connected to the signal bonding pads 118 in the inner row through a plurality of vias (not shown). Please refer to FIG. 6. The signal metal traces 206 and the $V_{SS}$ metal traces 202 are not electrically connected to each other because they are in different respective metal layers 214 and 212. Therefore, the $V_{SS}$ metal traces 202 and the signal metal traces 206 can share the same I/O device 102. In other words, space occupied by the I/O devices 102 is saved when electrically connecting the I/O device 102 and the bonding pads 116, since the $V_{SS}$ I/O unit 112 does not need to exclusively occupy an entire I/O device 102.

As shown in FIG. 5 and FIG. 6, the $V_{SS}$ metal trace 202 and the signal metal trace 206 originate from the same I/O device 102, and are electrically connected to a bonding pad 124 of the third row and a bonding pad 118 of the first row, respectively. Thus, I/O devices 102 can be simultaneously electrically connected to both third row of bonding pads 124 and first row of bonding pads 118. Power metal traces 204 originating from another I/O device 102a, are then selectively electrically connected to a second row of bonding pad 122. The $V_{SS}$ metal traces 208 also originate from the same I/O device 102a. The $V_{SS}$ metal traces 208 are on the third metal layer 216, and thus are not electrically connected to the power metal traces 204 on the first metal layer 212 and the second metal layer 214. The $V_{SS}$ metal traces 208 extend outward toward the second row of bonding pads 122, make a turn, and then electrically connect to the $V_{SS}$ metal traces 202 within the first metal layer 212 by using a plurality of vias (not shown), and so are finally electrically connected to the $V_{SS}$ bonding pads on the third row of bonding pads 124 in the outermost row. In this case, a power bonding pad in the second row of bonding pads 122 shares an I/O device 102a with a neighboring $V_{SS}$ bonding pad in the third row of bonding pads 124. Hence, different types of bonding pads can acquire sufficient metal trace width by different forms of via sharing. In other words, different types of bonding pads selectively share a single I/O device 102 by different forms of via sharing.

As shown in FIG. 8, the bonding pads of the first row 118 are electrically connected to the bonding fingers 132 in the outermost region through bonding wires 134, which form high loops. The second row of bonding pads 122 are electrically connected to the power ring 128 through bonding wires 134, forming medium loops. The third row of bonding pads 124 are electrically connected to the ground ring 126 through bonding wires 134, forming low loops. A general exception to this rule are the bonding pads 116 disposed along two edges (not shown), that is, bonding pads 116 disposed towards the corners of the chip 100. By providing bonding wires 134 with loops of differing radii, crossover of the bonding wires 134 is prevented, and so the yield for completed packages is improved.

The present invention presents the bonding pads 116 in a tri-tier staggered arrangement. This arrangement allows for the division of $V_{SS}$ current into more parallel branching currents. If the inductance for each branch current is l, and there are n parallel inductors, the total inductance is decreased to l/n. Since $\Delta V = L * di/dt$, voltage degradation is clearly improved in the present invention integrated circuit. In the following, a simplified model is utilized to compare differences between the present invention and the prior art.

Please refer to Table 1 and Table 2 below. Table 1 are simulated results of the total number of bonding pads and I/O devices of an example grid array packaged chip according to the prior art. Table 2 are simulated results for the total number of bonding pads and I/O devices of a functionally identical grid array packaged chip according to the present invention. Although small errors may be incurred due to approximation, the broad significance of the results should not be deeply affected by these small errors. The prior art model has bonding pads 26 arranged in a two-tier staggered form, and the number of I/O devices 12 is assumed to be 620. The number of signal I/O devices is 300, the number of $V_{DD}$ I/O devices is 40, the number of GND I/O devices is 40, the number of $V_{CC}$ I/O devices is 120 and the number of $V_{SS}$ I/O devices is 120. Since the I/O devices 12 correspond to the bonding pads 26 in a one to one manner in the prior art method, the total number of bonding pads 26 is also 620. Therefore, the number of I/O devices 12 disposed along each side of the chip 10 is about 155. In the preferred embodiment of the present invention, since the bonding pads 116 are arranged in a tri-tier staggered manner, and the $V_{SS}$ bonding pads are moved to the outer row 124, the total number of bonding pads in the inner row and the middle row is 500. As a result, the total number of the corresponding I/O devices 102 is reduced to 500, as each I/O device 102 can simultaneously support an additional $V_{SS}$ I/O. That is, there is no one to one correspondence between bonding pads 116 and I/O devices 102. The number of I/O devices 102 disposed along each side of the chip 100 is thus about 125, and therefore the chip size is significantly reduced. The number of bonding pads 116 in the outer row 124 is deduced to be approximately 250. If they are assumed to be distributed along the four sides evenly, the number is 248, and the number of all of the bonding pads 116 is about 748, which is an obvious increase over the prior art method. The extra bonding pads 116 may be allocated for power and ground electrical connections to further reduce power and ground inductance.

TABLE 1

|  | | Number Of I/O Devices | Number Of Bonding Pads |
|---|---|---|---|
| Prior Art | Signal | 300 | |
| | $V_{OD}$ | 40 | |
| | GND | 40 | |
| | $V_{cc}$ | 120 | |
| | $V_{aa}$ | 120 | |
| | Total Number | 620 | Total Number    620 |

TABLE 2

|  | | Number Of I/O Devices | Number Of Bonding Pads |
|---|---|---|---|
| Present Invention | Signal | 300 | Bonding Pads in The Inner Row + Bonding Pads In the Middle Row = 500 |
| | $V_{OD}$ | 40 | |
| | GND | 40 | |
| | $V_{cc}$ | 120 | Bonding Pads In The Outer Row = 248 |
| | $V_{aa}$ | 0 | |
| | Total Number | 500 | Total Number    748 |

Table 1 and Table 2 illustrate that the number of bonding pads, 116 provided by the present invention is greater than that of the prior art due to the tri-tier staggered arrangement of the bonding pads. The number of I/O devices 102 occupied exclusively by $V_{SS}$ I/O is reduced to zero by sharing I/O devices, and so the space occupied by all of the I/O devices 102 is significantly reduced. As shown in FIG. 4, in the preferred embodiment of the present invention, each I/O device 102 comprises four I/O units, arranging from an innermost region to an outermost region in sequence, having a striped shape. These striped-shaped I/O units 102 are then repetitively arranged outside the core circuit 101. When corresponding to the bonding pads 116, the top metal layer of the outmost row in the I/O devices 102 is the I/O buffering circuit ground ($V_{SS}$) ring 112. Therefore, the number of I/O devices 102 occupied exclusively by the $V_{SS}$ I/O device 112 is regarded as zero to effectively shrink the chip size and so permit a compact design structure.

In summary, it is an advantage of the present invention chip 100 that the number of $V_{SS}$ bonding pads is effectively increased. As shown in the simulated results of Table 1, the number of $V_{SS}$ bonding pads is increased by 128. Therefore, the $V_{SS}$ current is divided into many more branching currents that reduce the whole $V_{SS}$ inductance. Power bounce is thus reduced. Moreover, in the preferred embodiment of the present invention, as the $V_{SS}$ bonding pads are situated in the outer row 124, and as they are electrically connected to the I/O ground ring that is near the perimeter of the chip 100, the bonding wires 134 form the low loops to effectively reduce inductance. As shown in FIG. 8, the wire bonding method in the preferred embodiment of the present invention discloses that a loop for bonding pads situated in a front row is always higher than a loop for bonding pads situated in a back row, except for those bonding pads disposed around four corners. The probability of bonding wire crossover is thereby decreased, and the yield for the wire bonding process and packaging processes are both improved.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A grid array (GA) package integrated circuit(IC), the integrated circuit comprising:
   a substrate; and
   a chip on the substrate, the chip comprising:
   a core circuit;
   a plurality of I/O devices, each I/O device comprising a plurality of I/O units;
   a plurality of bonding pads arranged in a multi-tier structure surrounding said I/O device;
   a plurality of traces and a plurality of vias on a plurality of metal layers of the chip for selectively electrically connecting each I/O device and each bonding pad;
   a plurality of rings and a plurality of fingers surrounding the chip on the substrate; and
   a plurality of bonding wires for electrically connecting each bonding pad to a corresponding finger or to a corresponding ring;
   wherein different bonding pads selectively share a same I/O device through the traces.

2. The integrated circuit of claim 1 wherein each I/O device comprises four I/O units, and the top-most metal layers form four corresponding metal rings.

3. The integrated circuit of claim 2 wherein the four I/O units are a core circuit ground (GND) I/O unit, a core circuit power ($V_{DD}$) I/O unit, an I/O buffer circuit power ($V_{CC}$) I/O unit, and an I/O buffer circuit ground ($V_{SS}$) I/O unit, respectively.

4. The integrated circuit of claim 3 wherein the $V_{SS}$ I/O unit in each I/O device forms a top metal ring farthest from the center of the chip.

5. The integrated circuit of claim 3 wherein a bonding pad electrically connected to $V_{SS}$ and a bonding pad electrically connected to a signal share one of the I/O devices.

6. The integrated circuit of claim 3 wherein a bonding pad electrically connected to $V_{SS}$ and a bonding pad electrically connected to power share one of the I/O devices.

7. The integrated circuit of claim 3 wherein a bonding pad electrically connected to $V_{SS}$ and a neighboring bonding pad in a different tier share a same I/O device.

8. The integrated circuit of claim 3 wherein a bonding pad electrically connected to $V_{SS}$ and a bonding pad electrically connected to a signal share one of the I/O devices.

9. The integrated circuit of claim 3 wherein a bonding pad electrically connected to $V_{SS}$ and a bonding pad electrically connected to power share one of the I/O devices.

10. The integrated circuit of claim 3 wherein each bonding pad electrically connected to $V_{SS}$ shares a same I/O device with another bonding pad to minimize the number of I/O devices utilized by the $V_{SS}$ bonding pads.

11. The integrated circuit of claim 3 wherein one $V_{CC}$ I/O unit, one $V_{DD}$ I/O unit and one GND I/O unit in three neighboring I/O devices are electrically connected to three bonding pads respectively, and three $V_{SS}$ I/O units in the three neighboring I/O devices are electrically connected to at least one $V_{SS}$ bonding pad to share said neighboring I/O devices.

12. The integrated circuit of claim 3 wherein the number of I/O devices occupied exclusively by the $V_{SS}$ I/O units is zero by sharing said I/O devices.

13. The integrated circuit of claim 3 wherein the bonding pads electrically connected to the $V_{SS}$ I/O units are situated in the outermost rows of bonding pads.

14. The integrated circuit of claim 13 wherein the bonding pads electrically connected to the $V_{SS}$ I/O units are electrically connected to a ground ring through a plurality of bonding wires that each have a shortest path to minimize the total inductance (L) of the bonding wires.

15. The integrated circuit of claim 3 wherein the bonding pads electrically connected to the $V_{CC}$ I/O units are situated in the outermost rows of bonding pads.

16. The integrated circuit of claim 15 wherein the bonding pads electrically connected to the $V_{CC}$ I/O units are electrically connected to a power ring through a plurality of bonding wires that each have a shortest path to minimize the total inductance (L) of the bonding wires.

17. The integrated circuit of claim 1 wherein the bonding pads are arranged in a tri-tier staggered manner.

18. The integrated circuit of claim 1 wherein the integrated circuit is a very large scale integrated (VLSI) circuit, or an ultra large scale integrated (ULSI) circuit.

* * * * *